United States Patent
Sung

(10) Patent No.: US 9,166,187 B2
(45) Date of Patent: Oct. 20, 2015

(54) ORGANIC LIGHT EMITTING DEVICE AND POWER SUPPLY DEVICE THEREOF

(71) Applicant: Ultimate Image Corporation, Miaoli County (TW)

(72) Inventor: Chih-Feng Sung, Miaoli County (TW)

(73) Assignee: ULTIMATE IMAGE CORPORATION, Miaoli County (TW)

( * ) Notice: Subject to any disclaimer, the term of this patent is extended or adjusted under 35 U.S.C. 154(b) by 247 days.

(21) Appl. No.: 13/974,444

(22) Filed: Aug. 23, 2013

(65) Prior Publication Data

US 2014/0062301 A1    Mar. 6, 2014

(30) Foreign Application Priority Data

Sep. 6, 2012    (TW) .............................. 101132575 A

(51) Int. Cl.
| | | |
|---|---|---|
| H01L 29/08 | (2006.01) | |
| H01L 35/24 | (2006.01) | |
| H01L 51/00 | (2006.01) | |
| H01L 51/52 | (2006.01) | |
| H05B 33/08 | (2006.01) | |

(52) U.S. Cl.
CPC ........ *H01L 51/5203* (2013.01); *H05B 33/0896* (2013.01)

(58) Field of Classification Search
CPC .................. H01L 51/524; H01L 51/52; H01L 2251/5361
USPC ............................................. 315/52; 257/40
See application file for complete search history.

(56) References Cited

U.S. PATENT DOCUMENTS

| | | | |
|---|---|---|---|
| 6,084,579 A | | 7/2000 | Hirano |
| 8,134,173 B2* | | 3/2012 | Kamamori et al. ............. 257/99 |
| 8,803,136 B2* | | 8/2014 | Yamazaki et al. ............. 257/40 |
| 2011/0285277 A1 | | 11/2011 | Boerner |
| 2013/0082247 A1* | | 4/2013 | Kawata et al. .................. 257/40 |
| 2013/0112955 A1* | | 5/2013 | Yamazaki et al. ............. 257/40 |
| 2015/0028317 A1* | | 1/2015 | Ichihara et al. ................. 257/40 |

FOREIGN PATENT DOCUMENTS

| | | |
|---|---|---|
| CN | 1805635 | 7/2006 |
| CN | 101990785 | 3/2011 |
| CN | 102194853 | 9/2011 |
| CN | 102194854 | 9/2011 |
| JP | 2008034142 | 2/2008 |
| JP | 2001284058 | 10/2011 |

* cited by examiner

*Primary Examiner* — Quan Tra
(74) *Attorney, Agent, or Firm* — WPAT, PC; Justin King

(57) ABSTRACT

An organic light emitting device including a first substrate, at least an organic light emitting unit, a plurality of first electrode contacts and a plurality of second electrode contacts. The organic light emitting unit is disposed on the first substrate. The first electrode contacts are disposed on the first substrate at a margin of the organic light emitting unit, wherein adjacent two first electrode contacts are spaced by a first interval, and an end of each first electrode contact is electrically connected to the organic light emitting unit. The second electrode contacts are disposed on the first substrate at a margin of the organic light emitting unit, wherein adjacent two second electrodes are spaced by a second interval, an end of each second electrode contact is electrically connected to the organic light emitting unit, and the second interval is different from the first interval.

10 Claims, 3 Drawing Sheets

ORGANIC LIGHT EMITTING DEVICE AND POWER SUPPLY DEVICE THEREOF

FIELD OF THE INVENTION

The invention relates to a light emitting device and a power supply device thereof, and more particularly to an organic light emitting device and a power supply device thereof.

BACKGROUND OF THE INVENTION

An organic light emitting device (OLED) is a planar light source, which has several advantages such as wide viewing angle, compatible with the existing manufacturing processes of planar display devices, fast response time, emitting light without ultraviolet rays, small volume and light weight, and can be driven with direct current. Therefore, OLED has great advantages and development potential in the field of display device or lighting device.

In the manufacturing process of an organic light emitting element, an organic light emitting structure is formed between an anode and a cathode. Then, the anode and the cathode are electrically connected to positive and negative electrodes of an external power supply by conducting wires, respectively. In this way, light rays generated by supplying electrical energy to the organic light emitting structure are extracted from the anode side or the cathode side. However, since the organic light emitting element is a planar light source as mentioned above, several factors affects the voltages for driving two ends of the hole carrier and the electron carrier in the light emitting region of the organic light emitting structure when power of the external power supply is supplied to the organic light emitting element. For example, the length of the conducting wire through which the current passed, or the resistance of the anode or cathode leads to a voltage difference between the two ends of the hole carrier and the electron carrier. This leads to an uneven luminosity of the planar light source, which limits upsizing of the OLEDs.

Taking a conventional OLED lighting device as an example, in order to supply power and prevent uneven luminosity, a thin film electrode contact is disposed on the substrate formed with an OLED lighting element for electrically connecting with an external power source so as to supply power to the organic light emitting structure. Since the substrate of the OLED lighting element is normally rectangular, and the anode/cathode thin film electrode contacts are symmetrically disposed on the substrate, it is possible that they are misplaced in relative to positive/negative electrodes of the power supply device in assembling the OLED lighting element to form a lighting device. Once the anode/cathode electrodes are misplaced, the organic light emitting structure will burn out when electrically connected with the external power supply device and a reverse electric field applied. Therefore, an object of the invention is to increase a luminosity evenness of OLED, and at the same time prevent burn-out of OLED due to the misplacement of the anode/cathode electrodes.

SUMMARY OF THE INVENTION

One object of the invention is to provide an organic light emitting device, which includes a first substrate, at least an organic light emitting unit, a plurality of first electrode contacts, a plurality of second electrode contacts, a sealing structure and a second substrate. The surface of the first substrate is divided into a first region and a second region by a symmetry axis on the surface of the first substrate. The organic light emitting unit is disposed on the first substrate. The first electrode contacts are disposed on the first region at a margin of the organic light emitting unit, wherein adjacent two first electrode contacts are spaced by a first interval, and an end of each first electrode contact is electrically connected to the organic light emitting unit. The second electrode contacts are disposed on the second region at a margin of the organic light emitting unit, wherein adjacent two second electrode contacts are spaced by a second interval, an end of each second electrode contact is connected to the organic light emitting unit, and the second interval is different from the first interval. The second substrate is disposed on the organic light emitting unit. The sealing structure is provided around an outer periphery of the organic light emitting unit so that a sealed space is formed between the first substrate and the second substrate.

A further object of the invention is to provide a power supply device for the above-mentioned organic light emitting device, the power supply device includes a base, a plurality of first electrodes and a plurality of second electrodes. The base is for receiving the above-mentioned organic light emitting device. The first electrodes are disposed on the base, wherein adjacent two first electrodes are spaced by the above-mentioned first interval, an end of each first electrode is configured to be electrically connected to one of the above-mentioned first electrode contacts. The second electrodes are disposed on the base, wherein adjacent two second electrodes are spaced by the above-mentioned second interval, an end of each second electrode is configured to be electrically connected to one of the above-mentioned second electrode contacts.

According to the organic light emitting device and the power supply device thereof of the invention, since more than one anode contacts and cathode contacts are disposed, the difference among driving voltages for light emitting regions in the organic light emitting device can be reduced. Moreover, since the interval between adjacent two cathode contacts and the interval between adjacent two anode contacts are different, burn-out of the organic light emitting device caused by a reverse electric field being applied due to electrode misplacement can be prevented.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
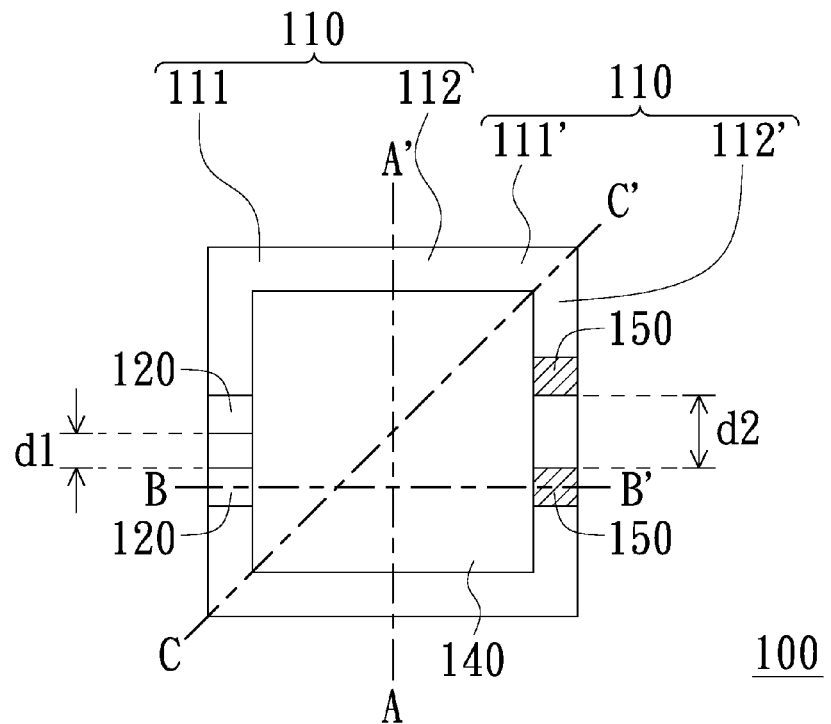
FIG. 1A is a top view schematic diagram showing an organic light emitting device according to an embodiment of the invention.

Please refer to FIG. 1A, which is a top view showing an organic light emitting device 100, which is viewed from a light emitting surface, according to an embodiment of the invention. The organic light emitting device 100 includes a first substrate 110, an organic light emitting unit 140, anode contacts 120 and cathode contacts 150. The first substrate 110 is made by a light transmissive material, for example, glass or a polyethylene terephthalate (PET) film with flexibility. When a forward electric field is applied to the organic light emitting unit 140 by electrically connecting the anode contacts 120 and the cathode contacts 150 with positive and negative electrodes of the external power supply, respectively, electroluminescent light generated by the organic light emitting unit 140 can be emitted to the outside through the first substrate 110. In this embodiment, there is a hypothetical symmetry axis on the surface of the first substrate 110 as shown by line A-A' in FIG. 1A. The surface of the first substrate 110 is divided into a first region 111 and a second region 112 by the symmetry axis A-A'. The anode contacts 120 are disposed on the first region 111 at a margin of the organic light emitting unit 140, while the cathode contacts 150 are disposed on the second region 112 at a margin of the organic light emitting unit 140. Adjacent two anode contacts 120 are spaced by a first interval d1, while adjacent two cathode contacts 150 are spaced by a second interval d2. In other embodiment, the surface of the first substrate 110 can also be divided into two symmetric regions 111' and 112' by a hypothetical symmetry axis C-C' so that anode contacts and cathode contacts can be disposed on regions 111' and 112, respectively.

Figure 1B:
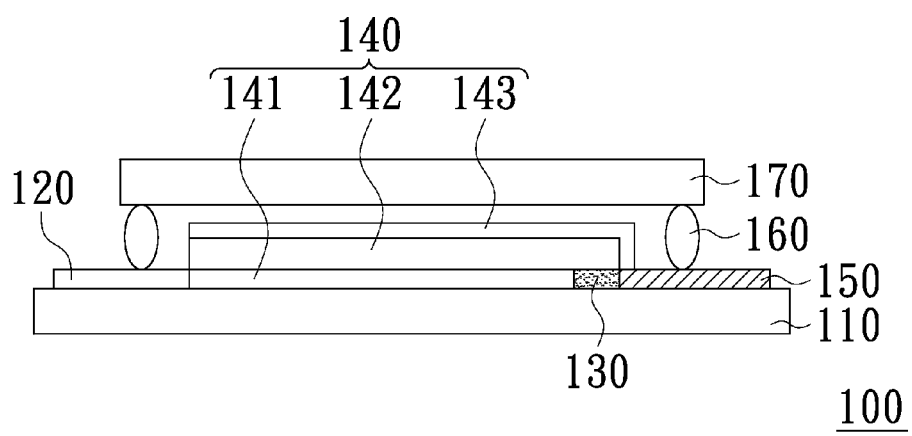
FIGS. 1B is a cross-section diagram showing an organic light emitting device according to an embodiment of the invention.

Since a plurality of organic light emitting units are formed on the first substrate, and each anode/cathode contact is electrically connected to each organic light emitting unit, the difference among driving voltages for light emitting regions in the organic light emitting device can be reduced such that the organic light emitting device can generate electroluminescent light with uniform light color. Moreover, since the second interval d2 between adjacent two cathode contacts is different from the first interval dl between adjacent two anode contacts, even if the electrodes are misplaced in the process of assembling the organic light emitting lighting device, the organic light emitting lighting device cannot be electrically connected to corresponding electrodes of the external power supply. Therefore, the organic light emitting device does not burn out by an applied reverse electric field due to electrode misplacement. In order to further describe the organic light emitting device 100 of the invention, please refer to FIG. 1B, which shows a cross-section of the organic light emitting device 100 along line B-B' shown in FIG. 1A.

An anode layer 141, at least an organic light emitting structure 142 and a cathode layer 143 are sequentially formed on the first substrate 110 such that the organic light emitting unit 140 is formed. It is worth to mention that an inverted organic light emitting unit (abbreviated as Inverted OLED) can be formed by sequentially forming a cathode layer, an organic light emitting structure and an anode layer on a light transmissive first substrate according to other embodiment of the invention. Moreover, the organic light emitting structure can be a monochromatic light source or a white light source formed by organic light emitting structures each emitting different colored light. However, the invention is not limited to any light source. An end of each anode contact 120 is electrically connected to the anode layer 141, and an end of each cathode contact 150 is electrically connected to the cathode layer 143. An insulating structure 130 is provided between the anode layer 141 and the cathode contacts 150 for preventing short-circuit. Since external moisture or impurities damage the organic light emitting structure or reduce an operating life of the organic light emitting device, the following structures are formed after the above-mentioned structures are sequentially formed on the first substrate 110. That is, a sealing material is coated on the first substrate 110, and then a second substrate 170 is formed on the organic light emitting unit 140. The second substrate 170 can be made by a transparent material such as glass, an opaque material such as metal, or a flexible material such as PET. Finally, the sealing material is processed to form a sealing structure 160. In this way, a sealed space is formed between the first substrate 110 and the second substrate 170 so that the organic light emitting structure will not be affected by external moisture or impurities.

Figure 2:
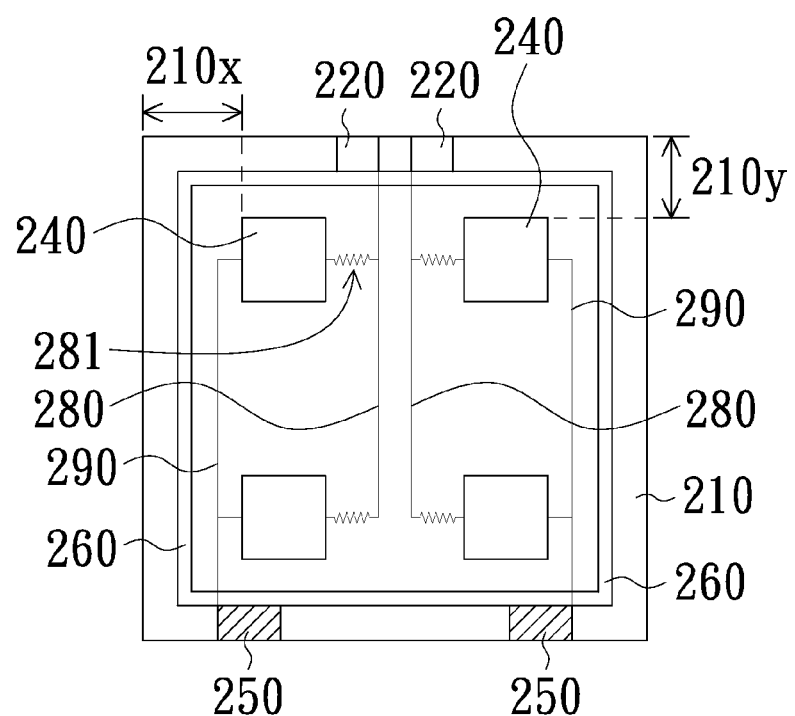
FIG. 2 is a top view schematic diagram showing an organic light emitting device according to another embodiment of the invention.

FIG. 2 is a top view schematic diagram showing an organic light emitting device, which is viewed from a backlight surface, according to another embodiment of the invention. A plurality of organic light emitting units 240 are formed on a first substrate 210. However, for convenience of description, a second substrate is not shown in FIG. 2, and only four organic light emitting units 240 are shown. The plurality of organic light emitting units 240 are disposed on the first substrate 210. Thus, a plurality of longitudinal interspaces 210x and lateral interspaces 210y are formed on the first substrate 210 between adjacent organic light emitting units 240. A plurality of anode conducting wires 280 are respectively disposed on a longitudinal interspace 210x or a lateral interspace 210y, while a plurality of cathode conducting wires 290 are respectively disposed on a longitudinal interspace 210x or a lateral interspace 210y. The cathode conducting wires 290 and the anode conducting wires 280 do not contact with each other. An electronic element 281 can be selectively formed between the anode conducting wire 280 and the anode layer of each organic light emitting unit 240. One end of the electronic element 281 is electrically connected to the anode layer, while the other end is electrically connected to the anode conducting wire 280. Each anode contact 220 is electrically connected to anode layers of the plurality of organic light emitting units 240 through the anode conducting wires 280 and the electronic elements 281. Each cathode contact 250 is electrically connected to cathode layers of the plurality of organic light emitting units 240 through the cathode conducting wires 290. The electronic element 281 can be a resistor or a transistor etc. for limiting or adjusting an electrical power value between the anode conducting wire and the anode layer. Although a resistor is shown in FIG. 2 as an example of the electronic element 281, this does not limit the invention. A sealing structure 260 is provided around an outer periphery of the organic light emitting unit 240 such that a sealed space is formed between the first substrate and the second substrate. This prevents permeation of external moisture or impurities into the organic light emitting structure.

In this embodiment, not only electrically connecting each anode/cathode contact with the organic light emitting unit, respectively, enables the organic light emitting device to generate electroluminescent light with uniform light color, but also burn-out of the organic light emitting device caused by a reverse electric field being applied due to electrode misplacement can be effectively prevented. Also, since an electronic element is disposed between the anode contact and the anode layer, even if moisture or impurities adheres to the organic light emitting structure during the manufacturing process, which leads to an excess amount of current generated due to short-circuit of the anode layer and the cathode layer, the electronic element can limit the power passing between the anode contact and the organic light emitting unit and thus prevent burn-out of the organic light emitting unit.

Moreover, the invention further provides a power supply device for the organic light emitting device according to the invention.

Figure 3:
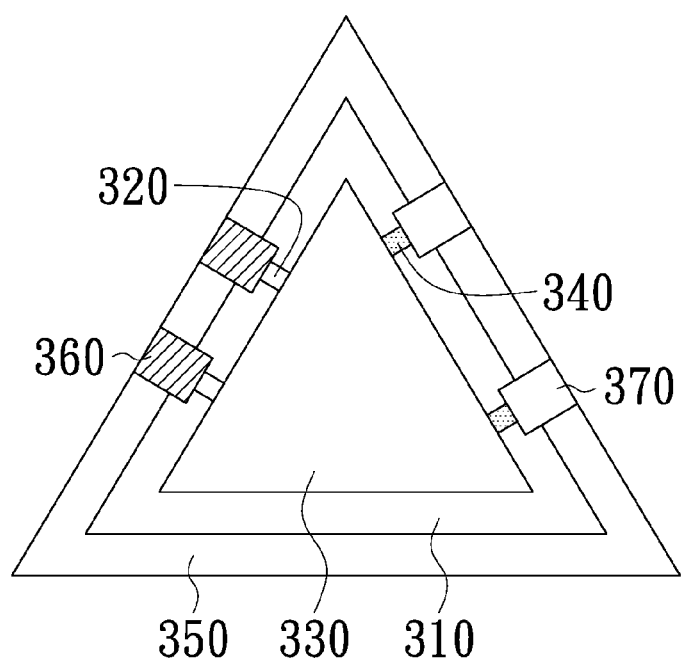
FIG. 3 is a schematic diagram showing a usage state of a triangular organic light emitting device and a power supply device thereof according to the invention.
Figure 4:
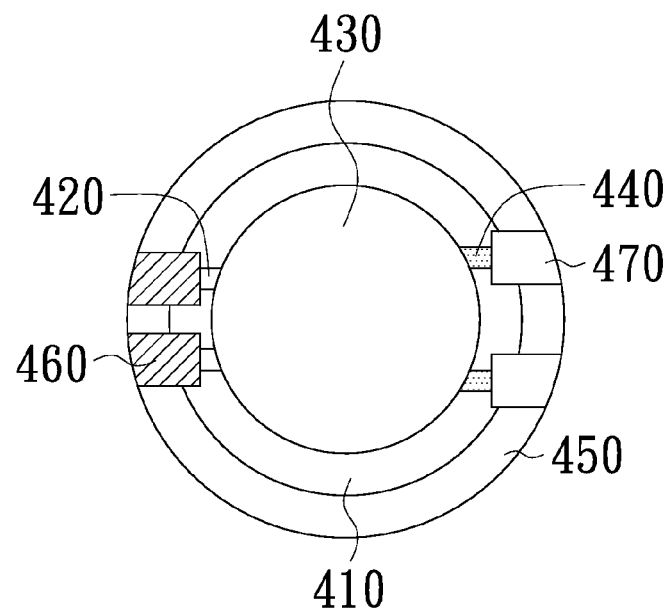
FIG. 4 is a schematic diagram showing a usage state of a round organic light emitting device and a power supply device thereof according to the invention.
Figure 5:
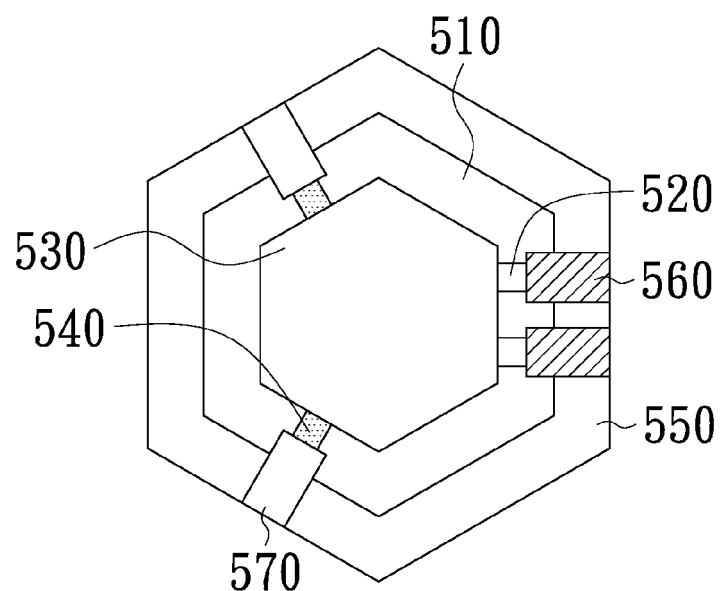
FIG. 5 is a schematic diagram showing a usage state of a regular hexagonal organic light emitting device and a power supply device thereof according to the invention.

FIGS. 3-5 respectively show a usage state of an organic light emitting device with a different shape and a power supply device thereof according to the invention.

Please refer to FIG. 3, a triangular organic light emitting device includes a first substrate 310, an organic light emitting unit 330, anode contacts 320 and cathode contacts 340. A power supply device includes a triangular base 350 for receiving the triangular organic light emitting device. A plurality of positive electrodes 360 are disposed on a side of the triangle base 350, wherein an interval between adjacent two positive electrodes 360 equals to an interval between adjacent two anode contacts 320. An end of each positive electrode 360 is configured to be electrically connected to one of the anode contacts 320. A plurality of negative electrodes 370 are disposed on another side of the triangle base 350, wherein an interval between adjacent two negative electrodes 370 equals to an interval between adjacent two cathode contacts 340. An end of each negative electrode 370 is configured to be electrically connected to one of the cathode contacts 340.

Further, please refer to FIG. 4, a round organic light emitting device includes a first substrate 410, an organic light emitting unit 430, anode contacts 420 and cathode contacts 440. A power supply device includes a round base 450 for receiving the round organic light emitting device. A plurality of positive electrodes 460 are disposed on a side of the round base 450, and an end of each positive electrode 460 is configured to be electrically connected to one of the anode contacts 420. A plurality of negative electrodes 470 are disposed on another side of the round base 450, and an end of each negative electrode 470 is configured to be electrically connected to one of the cathode contacts 440.

Finally, please refer to FIG. 5, a regular hexagonal (or honeycomb-shaped) organic light emitting device includes a first substrate 510, an organic light emitting unit 530, anode contacts 520 and cathode contacts 540. A power supply device includes a regular hexagonal base 550 for receiving the regular hexagonal organic light emitting device. An end of each positive electrode 560 is configured to be electrically connected to one of the anode contacts 520. An end of each negative electrode 570 is configured to be electrically connected to one of the cathode contacts 540. It can be known from FIGS. 3-5 that the organic light emitting device and the power supply device thereof according to the invention not only can prevent misplacement of electrodes, but also the shape can be designed according to several different usage objects so as to meet the requirement of the consumers.

In summary, according to the organic light emitting device and the power supply device thereof of the invention, since more than one anode contacts and cathode contacts are disposed, a difference between driving voltages for light emitting regions in the organic light emitting device can be reduced, which enables the organic light emitting device to generate electroluminescent light with uniform light color. Moreover, since an interval between adjacent two cathode contacts is different from an interval between adjacent two anode contacts, burn-out of the organic light emitting device caused by an applied reverse electric field due to electrode misplacement can be prevented. This ensures that the organic light emitting device has normal operating life.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An organic light emitting device, comprising:
   a first substrate, wherein a surface of the first substrate is divided into a first region and a second region by a symmetry axis on the surface of the first substrate;
   at least an organic light emitting unit being disposed on the first substrate;
   a plurality of first electrode contacts being disposed on the first region at a margin of the organic light emitting unit, wherein adjacent two first electrode contacts are spaced by a first interval, and an end of each first electrode contact is electrically connected to the organic light emitting unit;
   a plurality of second electrode contacts being disposed on the second region at a margin of the organic light emitting unit, wherein adjacent two second electrode contacts are spaced by a second interval, an end of each second electrode contact is connected to the organic light emitting unit, and the second interval is different from the first interval;
   a second substrate being disposed on the organic light emitting unit; and
   a sealing structure being provided around an outer periphery of the organic light emitting unit so that a sealed space is formed between the first substrate and the second substrate.

2. The organic light emitting device according to claim 1, wherein a shape of the first substrate is triangle, rectangle, polygon with more than four sides, or round.

3. The organic light emitting device according to claim 1, wherein the organic light emitting unit comprises a first electrode layer, at least an organic light emitting structure and a second electrode layer, an end of each first electrode contact is electrically connected to the first electrode layer, and an end of each second electrode contact is electrically connected to the second electrode layer.

4. The organic light emitting device according to claim 3, wherein the first substrate is light transmissive, the first electrode layer is an anode layer, the second electrode layer is a cathode layer, and the anode layer, the organic light emitting structure and the cathode layer are sequentially disposed on the first substrate.

5. The organic light emitting device according to claim 3, wherein a plurality of organic light emitting units are disposed on the first substrate in an array such that a plurality of longitudinal interspaces and a plurality of lateral interspaces are formed between the organic light emitting units on the first substrate.

6. The organic light emitting device according to claim 5, further comprising:
   a plurality of first conducting wires being disposed on the longitudinal interspaces or the lateral interspaces on the first substrate, respectively, wherein each first conducting wire at least electrically connects one of the first electrode layers with one of the first electrode contacts; and
   a plurality of second conducting wires being disposed on the longitudinal interspaces or the lateral interspaces on the first substrate, respectively, wherein the second conducting wires and the first conducting wires do not contact with each other, and each second conducting wire at least electrically connects one of the second electrode layers with one of the second electrode contacts.

7. The organic light emitting device according to claim 6, further comprising:
a plurality of electronic elements being disposed between the first conducting wires and the first electrode layers, respectively, wherein each electronic element electrically connects the first conducting wire and the first electrode layer, for limiting or adjusting an electrical power value passing between the first conducting wire and the first electrode layer.

8. A power supply device for the organic light emitting device according to claim 1, comprising:
a base for receiving the organic light emitting device;
a plurality of first electrodes being disposed on the base, wherein adjacent two first electrodes are spaced by the first interval, and an end of each first electrode is configured to electrically connect with one of the first electrode contacts; and
a plurality of second electrodes being disposed on the base, wherein adjacent two second electrodes are spaced by the second interval, and an end of each second electrode is configured to electrically connect with one of the second electrode contacts.

9. The power supply device according to claim 8, wherein a shape of the base is triangle, rectangle, polygon with more than four sides, or round.

10. The power supply device according to claim 8, wherein the first electrodes are positive electrodes and the second electrodes are negative electrodes.

* * * * *